(12) United States Patent
Harvard et al.

(10) Patent No.: US 8,395,947 B2
(45) Date of Patent: Mar. 12, 2013

(54) INCREASED DRAM-ARRAY THROUGHPUT USING INACTIVE BITLINES

(75) Inventors: Qawi I. Harvard, Santa Clara, CA (US); Robert J. Drost, Los Altos, CA (US); R. Jacob Baker, Boise, ID (US)

(73) Assignee: Oracle America, Inc., Redwood Shores, CA (US)

( * ) Notice: Subject to any disclaimer, the term of this patent is extended or adjusted under 35 U.S.C. 154(b) by 159 days.

(21) Appl. No.: 13/082,785

(22) Filed: Apr. 8, 2011

(65) Prior Publication Data

US 2011/0261637 A1 Oct. 27, 2011

Related U.S. Application Data

(60) Provisional application No. 61/322,125, filed on Apr. 8, 2010.

(51) Int. Cl.
*G11C 7/10* (2006.01)
(52) U.S. Cl. .................................. 365/189.15; 365/205
(58) Field of Classification Search ............. 365/189.15, 365/205, 208
See application file for complete search history.

(56) References Cited

U.S. PATENT DOCUMENTS

2009/0103353 A1* 4/2009 Arimoto et al. ............... 365/149
2009/0168551 A1* 7/2009 Kim et al. ................. 365/189.05

* cited by examiner

*Primary Examiner* — Vu Le
(74) *Attorney, Agent, or Firm* — Park, Vaughan, Fleming & Dowler LLP

(57) ABSTRACT

A memory device with increased communication bandwidth is described. In this memory device, control logic routes data signals from a memory array using inactive bitlines in response to a read command. These data signals are then placed on an adjacent unused input/output (I/O) line or routing channel, as opposed to a proximate I/O line that is in use. For example, unused bitlines located on the top and bottom of the memory array may be used to route data signals to adjacent local I/O lines. In particular, the data signals can be placed on unused local I/O lines which are associated with adjacent bitline sense amplifiers. The resulting increased communication bandwidth can overcome the constraints imposed by the limited number of local I/O lines in the memory device without appreciably increasing the chip size, power consumption, or cost.

20 Claims, 6 Drawing Sheets

INCREASED DRAM-ARRAY THROUGHPUT USING INACTIVE BITLINES

CROSS REFERENCE TO RELATED APPLICATIONS

This application claims priority under 35 U.S.C. §119(e) to U.S. Provisional Application Ser. No. 61/322,125, entitled "Increased DRAM-Array Throughput Utilizing Inactive Bitlines," by Qawi Harvard, Robert J. Drost, and R. Jacob Baker, filed on Apr. 8, 2010, the contents of which are herein incorporated by reference.

GOVERNMENT LICENSE RIGHTS

The United States Government may have a paid-up license in this invention and the right in limited circumstances to require the patent owner to license others on reasonable terms as provided for by the terms of Contract No. H98230-09-C-0267 awarded by the United States Department of Defense.

FIELD

The present disclosure generally relates to memory devices. More specifically, the present disclosure relates to a memory device that selectively couples an output of a sense amplifier to an unused input/output (I/O) line of the memory device, as opposed to an I/O line of the memory device that is proximate to the sense amplifier.

RELATED ART

Dynamic random access memory (DRAM) is used in a wide range of computer systems and computing devices. Because of power consumption, chip-size and price constraints, DRAM chips in these systems typically only include up to eight input/output (I/O) lines, which can restrict the communication bandwidth.

However, recently developed chip-to-chip interconnects allow as many as ten times the number of I/O lines, which can be used to provide a higher communication bandwidth with existing DRAM chips. For example, increased DRAM communication bandwidth can be enabled using neoteric chip-to-chip interconnect technology.

Nonetheless, even with this increased external communication bandwidth, increasing the internal communication bandwidth of a DRAM chip can be challenging. In particular, it can be difficult to access more data from the memory array in DRAM because of constraints in the local I/O lines or routing channel.

A number of techniques have been proposed to address this challenge. In one technique, the memory array is divided into smaller groups, thereby reducing the parasitic load on the local I/O lines, which can allow these I/O lines to be accessed more rapidly (i.e., the data rate can be increased). However, this technique typically increases the size of a DRAM chip significantly because of the area overhead associated with dividing or sectioning the memory array. The resulting increased cost and power consumption of the DRAM chips can be prohibitive in many applications.

In another technique, the number of metal tracks allocated for local I/O line routing is increased, thereby reducing the parasitic load and allowing a higher data rate. However, this technique increases the size of the local bitline sense layout where the local I/O lines are located, and therefore also increases the chip size, power consumption and cost.

Hence, what is needed is a memory device without the above-described problems.

SUMMARY

One embodiment of the present disclosure provides a memory device that includes: an array of memory cells that store information; a first bitline coupled to the memory cells in the array and a second bitline coupled to the memory cells in the array; and a sense amplifier coupled to the first bitline and the second bitline. During operation, this sense amplifier: receives the information stored in a given memory cell via one of the first bitline and the second bitline. Next, in response to an activation signal, the memory device develops a signal by amplifying the information and then, in response to a gating signal, outputs the signal. The memory device also includes control logic which, in response to a read command, turns on a first isolation signal and turns off a second isolation signal, thereby coupling the sense amplifier to the given memory cell via the first bitline. The memory device provides the activation signal to the sense amplifier to develop the signal. After the signal is developed, the control logic turns off the first isolation signal and turns on the second isolation signal, thereby coupling an output of the sense amplifier to an unused input/output (I/O) line of the memory device via the second bitline, as opposed to an I/O line of the memory device that is proximate to the sense amplifier. The control logic also provides the gating signal to the sense amplifier, thereby outputting the signal on the unused I/O line.

In some embodiments, the memory device includes a word line coupled to the memory cells in the array. This word line may select the given memory cell and, in response to the read command, the control logic may turn on the word line.

Furthermore, in some embodiments the memory device includes a transistor coupled to the second bitline and proximate to the unused I/O line. In these embodiments, the control logic may provide another gating signal to the transistor and, in response to the other gating signal, the transistor may drive the signal onto the unused I/O line.

Additionally, in some embodiments the memory device includes another amplifier coupled to the second bitline and proximate to the unused I/O line. In these embodiments, the control logic may provide another gating signal to the other amplifier and, in response to the other gating signal, the other amplifier may amplify the signal received via the second bitline and may drive the signal onto the unused I/O line.

Note that the memory device may include: dynamic random access memory (DRAM) and/or NOR flash.

Moreover, prior to providing the activation signal, the control logic may provide a pre-charge signal to the sense amplifier, thereby approximately zeroing the output of the sense amplifier. Note that a propagation time to route the signal from the sense amplifier to the unused I/O line via the second bitline may be less than a pre-charge time associated with the pre-charge signal.

Furthermore, the first bitline and the second bitline may each include a logically complementary pair of bitlines, and the I/O line and the unused I/O line may each include a pair of I/O lines.

Another embodiment provides a computer system that includes the memory device.

Another embodiment provides a method for reading information from the memory device in response to the read command. During this method, the memory device turns on the first isolation signal and turns off the second isolation signal, thereby coupling the sense amplifier in the memory device to the given memory cell in the array of memory cells via the first bitline. Note that the given memory cell stores the information, and the memory cells in the array are coupled to the sense amplifier by the first bitline and the second bitline. The memory device also provides the activation signal to the sense amplifier to develop the signal by amplifying the information. After the signal is developed, the memory device turns off the first isolation signal and turns on the second isolation signal, thereby coupling the output of the sense amplifier to the unused I/O line of the memory device via the second bitline, as opposed to the I/O line of the memory device that is proximate to the sense amplifier. Furthermore, the memory device provides the gating signal to the sense amplifier, thereby outputting the signal on the unused I/O line.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a memory device, a computer system that includes the memory device, and a method for reading information from the memory device are described. In the memory device, control logic routes data signals from a memory array using inactive bitlines in response to a read command. These data signals are then placed on an adjacent unused input/output (I/O) line or routing channel (as opposed to a proximate I/O line that is in use). For example, unused bitlines located on the top and bottom of the memory array may be used to route data signals to adjacent local I/O lines. In particular, the data signals can be placed on unused local I/O lines which are associated with adjacent bitline sense amplifiers.

In this way, this technique for reading information increases the number of data signals that can be accessed in memory devices (i.e., the communication bandwidth is increased), such as dynamic random access memory (DRAM). Moreover, the technique for reading information can remove the constraint on the internal communication bandwidth of the memory arrays in these memory devices, which is a result of a limited number of local I/O lines. Furthermore, this problem can be solved without appreciably increasing the chip size, power consumption, page size or cost, so that the resulting memory devices can still be used in a wide variety of applications, such as computing.

Figure 1:
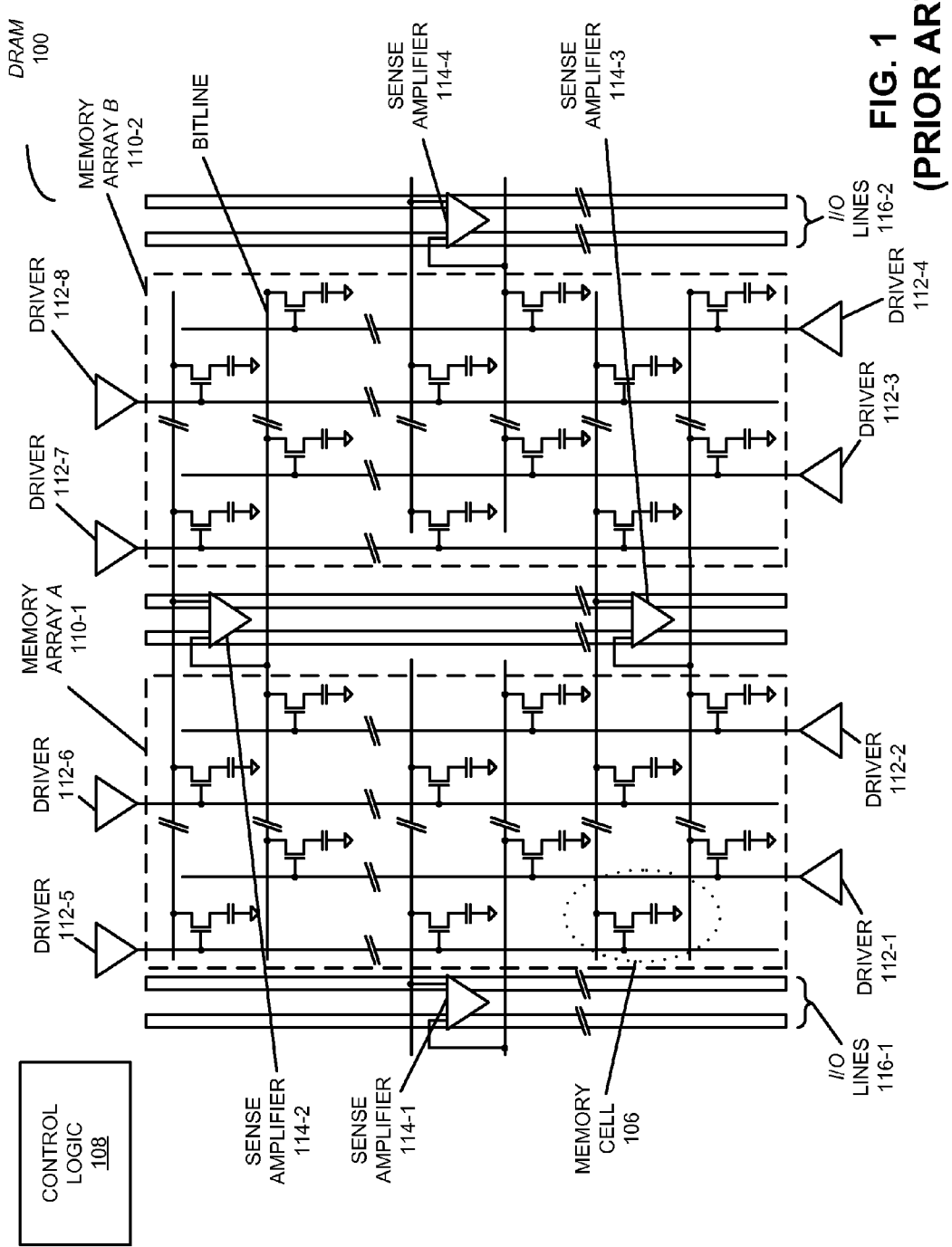
FIG. 1 is a block diagram illustrating an existing dynamic-random-access-memory (DRAM).

We now describe embodiments of the memory device. FIG. 1 presents a block diagram illustrating an existing DRAM 100. This memory includes: memory cells (such as memory cell 106) arranged in memory arrays A and B 110 (which store information or data), row drivers 112 at the edge of memory arrays A and B 110, bitline sense amplifiers 114 in between memory arrays A and B 110, and local I/O lines 116 placed within the sense-amplifier stripe.

Figure 3A:
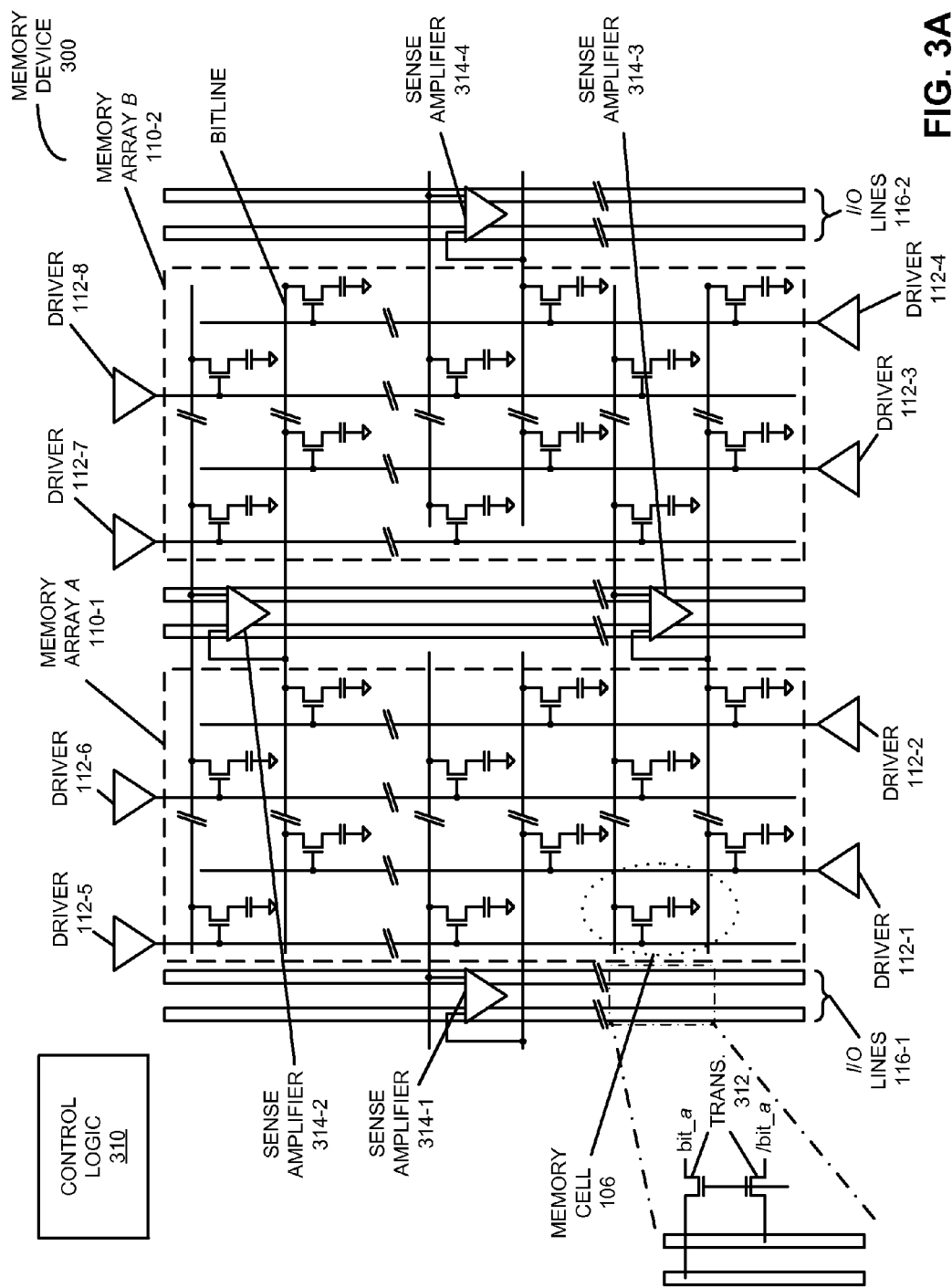
FIG. 3A is a block diagram illustrating a memory device in accordance with an embodiment of the present disclosure.
Figure 3B:
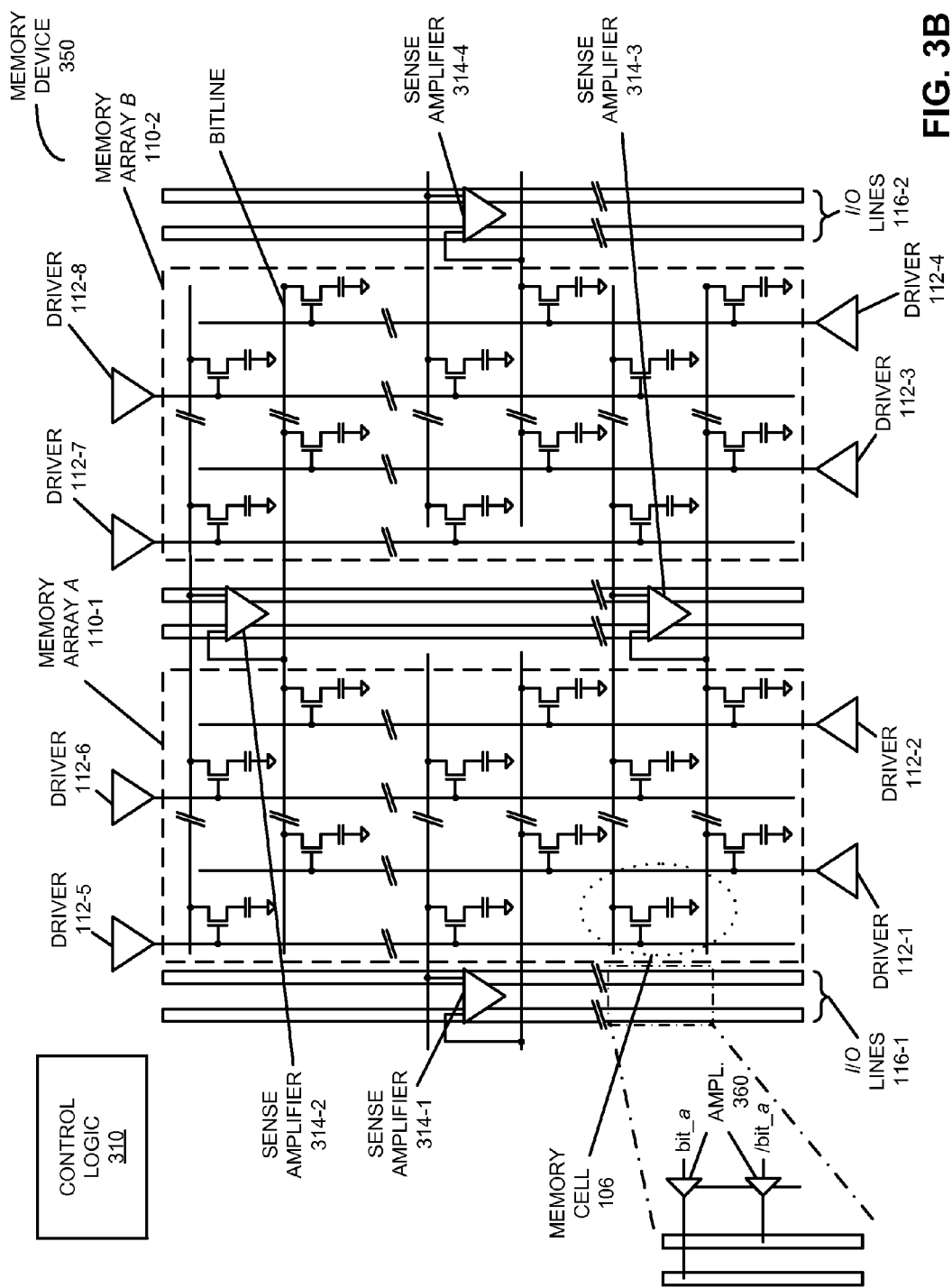
FIG. 3B is a block diagram illustrating a memory device in accordance with an embodiment of the present disclosure.

This simplified schematic of a memory device also illustrates the limited number of local I/O lines 116 available to memory arrays A and B 110. In the present disclosure, unused bitlines are used to route data from memory B 110-2 through memory array A 110-1 to local I/O lines 116-1 found on the left-hand side of memory 100. Alternatively, unused bitlines may be used to route data from memory A 110-1 through memory array B 110-2 to local I/O lines 116-2 found on the right-hand side of memory 100. (In the discussion that follows, the former embodiment is used as an illustrative example.) In order to perform these operations, bitline sense amplifiers 114 are slightly modified into bitline sense amplifiers 314 (FIGS. 3A and 3B).

Figure 2:
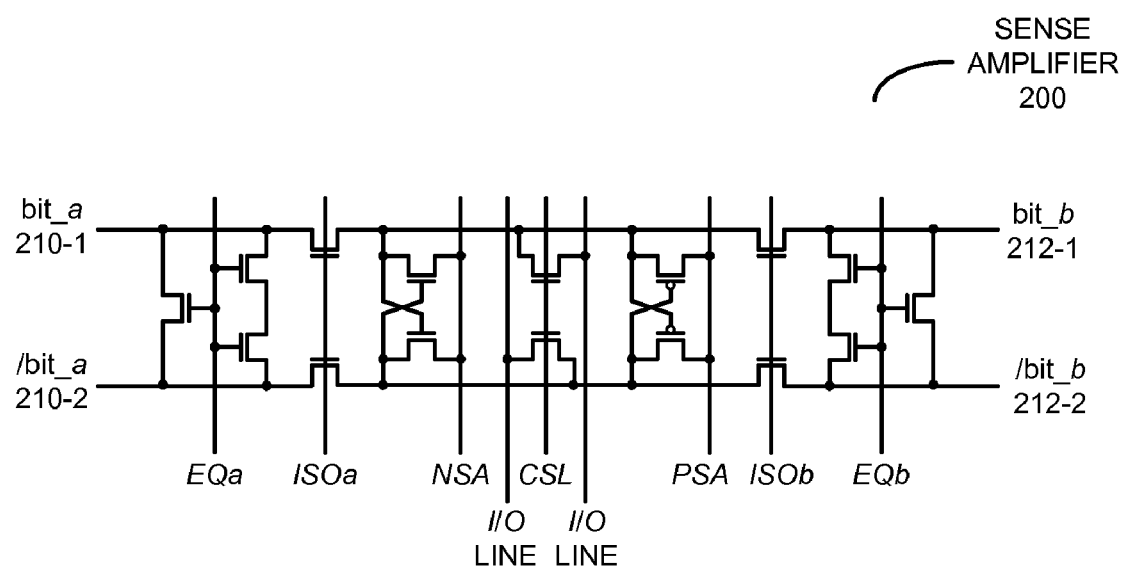
FIG. 2 is a block diagram illustrating a bitline sense amplifier in accordance with an embodiment of the present disclosure.

An example of such a bitline sense amplifier 200 is shown in FIG. 2. This sense amplifier is used to sense the data from memory array B 110-2 (FIG. 1). In particular, in response to a read signal (and a read address), control logic 310 in FIG. 3 (such as the row-path control logic) may generate control signals (such as isolation, pre-charge or equilibrate, activation and gating signals) that are sent to sense amplifiers 200 (and, more generally, to bitline sense amplifiers 314 in FIGS. 3A and 3B). In a standard bitline sense amplifier, only one isolation (ISO) signal can be asserted at any given time, thereby isolating the sense amplifier from memory array A 110-1 or memory array B 110-2 (FIG. 1). (Thus, at a given time, sense amplifiers are typically read from right to left or from left to right, but not both.) However, in the present disclosure control logic 310 (FIGS. 3A and 3B) has been modified (relative to control logic 108 in FIG. 1) so that ISOb (for memory array B 110-2 in FIGS. 3A and 3B) is asserted or enabled to allow data from memory array B 110-2 (FIGS. 3A and 3B) to be placed on sense amplifier 200, and ISOa (for memory array A 110-1 in FIGS. 3A and 3B) is disabled.

Then, control logic 310 (FIGS. 3A and 3B) provides the activation signals PSA and NSA, which fire sense amplifier 200. Furthermore, when fully developed, control logic 310 (FIGS. 3A and 3B) provides the gating signal CSL, and the sensed data signal output by sense amplifier 200 is placed on bitlines 212 (which can include a single bitline or a logically complementary pair of bitlines).

After the sense amplification has taken place (and before CSL is provided), control logic 310 (FIGS. 3A and 3B) enables ISOa and disables ISOb. Note that a delayed version of ISOb can be used to implement the enabled ISOa signal. In the process, the sensed data signal is sent from bit_b 212-1 to bit_a 210-1 (as well as /bit_b 212-2 to /bit_a 210-2). This takes the data from memory array B 110-2 (FIGS. 3A and 3B) and routes it through the unused bitlines in memory array A 110-1 (FIGS. 3A and 3B) toward unused local I/O lines 116-1 on the other side of memory array A 110-1 (on the left-hand side of FIGS. 3A and 3B), as opposed to one or more local I/O lines 116-2 (FIGS. 3A and 3B) that are proximate to sense amplifier 200.

As shown in FIG. 3A, which presents a block diagram illustrating memory device 300 (such as DRAM and/or NOR flash), I/O transistors 312 couple unused bitlines (such as bitlines 210 in FIG. 2) to the unused local I/O lines 116-1.

These I/O transistors 312 may be gated by additional gating signals provided by control logic 310. When control logic 310 provides the additional gating signal to a given I/O transistor, this I/O transistor may drive the sensed data signal onto the unused local I/O line(s) 116-1.

Note that these additional I/O transistors can be placed in the bitline sense-amplifier stripe. This allows the data to be passed between memory arrays 110 to the unused local I/O lines 116-1, effectively doubling the number of I/O lines available to read/write data out of memory array B 110-2. Furthermore, note that, by using adjacent unused local I/O lines, memory device 300 does not use additional local I/O lines or sectioning of memory arrays 110 to increase the internal communication bandwidth. Thus, this technique for reading information can route large amounts of data out of memory arrays 110 without increasing the chip size, power consumption or cost.

In some embodiments, transistors 312 may be replaced with amplifiers. This is shown in FIG. 3B, which presents a block diagram illustrating memory device 350 that includes amplifiers 360. In particular, in response to an additional gating signal provided by control logic 310, these amplifiers may amplify the sensed data signal on the inactive bitlines (such as bitlines 210 in FIG. 2) and may output it onto the unused local I/O lines 116-1.

While not described previously, control logic 310 may perform additional functions. For example, memory device 300 may include a word line coupled to the memory cells in one of memory arrays 110. This word line may select the given memory cell (such as one of 256 memory cells) and, in response to the read command, control logic 310 may turn on the word line. Furthermore, prior to or after asserting ISOb, control logic 310 may provide pre-charge signal EQ to an appropriate one of sense amplifiers 314. While EQ is asserted, bitlines (such as bitlines 212 in FIG. 2) may be shorted and the inputs to this sense amplifier may be coupled to Vdd/2 in order to pre-charge this sense amplifier, thereby zeroing its output.

Note that one challenge associated with this technique for reading information is hiding the aforementioned routing operation from the pre-charge cycle (i.e., while EQ is asserted). This can be accomplished by using proper timing. In particular, when using bitlines 210 (FIG. 2) for a current read command, bitlines 212 (FIG. 2) cannot be used for another read command. To ensure this condition is met, a pre-charge time associated with the EQ signal for an appropriate one of sense amplifiers 314 (which is to be used in conjunction with the other read command) may be longer than a propagation time to route the sensed data signal from the sense amplifier (which is being used in conjunction with the current read command) to the unused local I/O line(s) 116-1.

Figure 4:
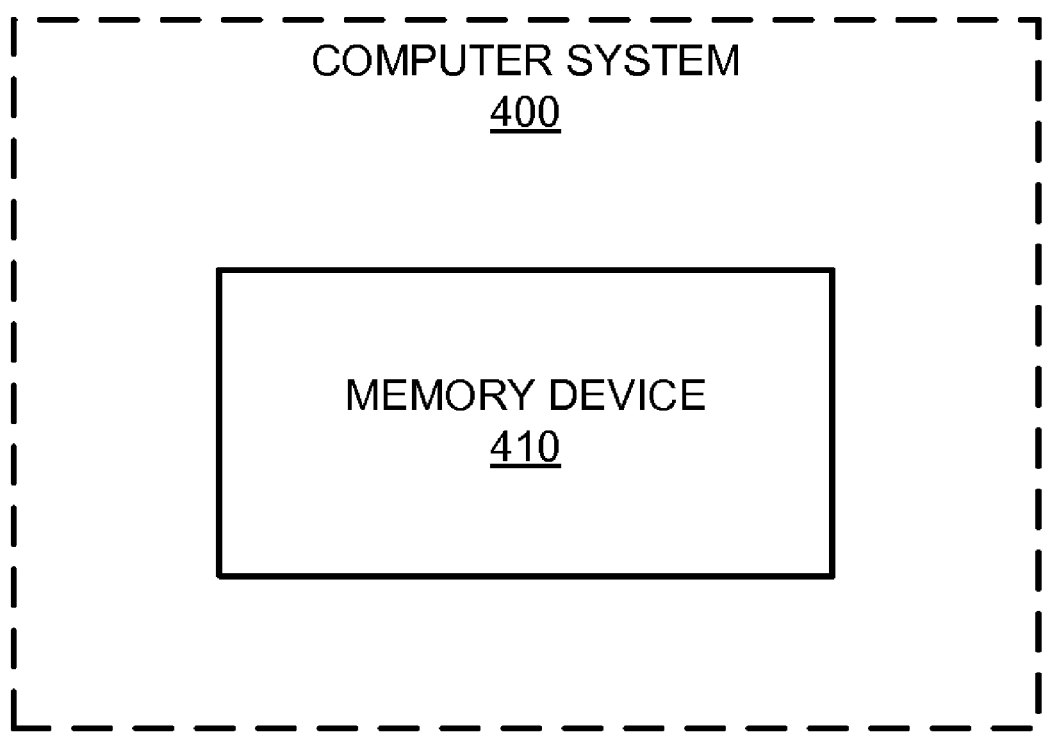
FIG. 4 is a block diagram of a computer system that includes the memory device of FIG. 3A or 3B in accordance with an embodiment of the present disclosure.

We now describe embodiments of a computer system that includes an embodiment of memory devices 300 (FIG. 3A) or 350. FIG. 4 presents a block diagram of a computer system 400 that includes memory device 410. More generally, embodiments of the memory device may be used in a variety of applications, including: VLSI circuits, communication systems, storage area networks, data centers, networks (such as local area networks), memory components (such as those that include a high I/O count), memory systems, and/or computer systems (such as multiple-core processor computer systems, computer systems that include components that communicate via capacitive proximity communication, computer systems that include components that communicate via optical proximity communication, etc.). Note that computer system 400 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Bitline sense amplifier 200 (FIG. 2), memory device 300 (FIG. 3A), memory device 350 (FIG. 3B), and/or computer system 400 may include fewer components or additional components. Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values. Thus, the control signals in FIGS. 3A and 3B may be analog signals.

Figure 5:
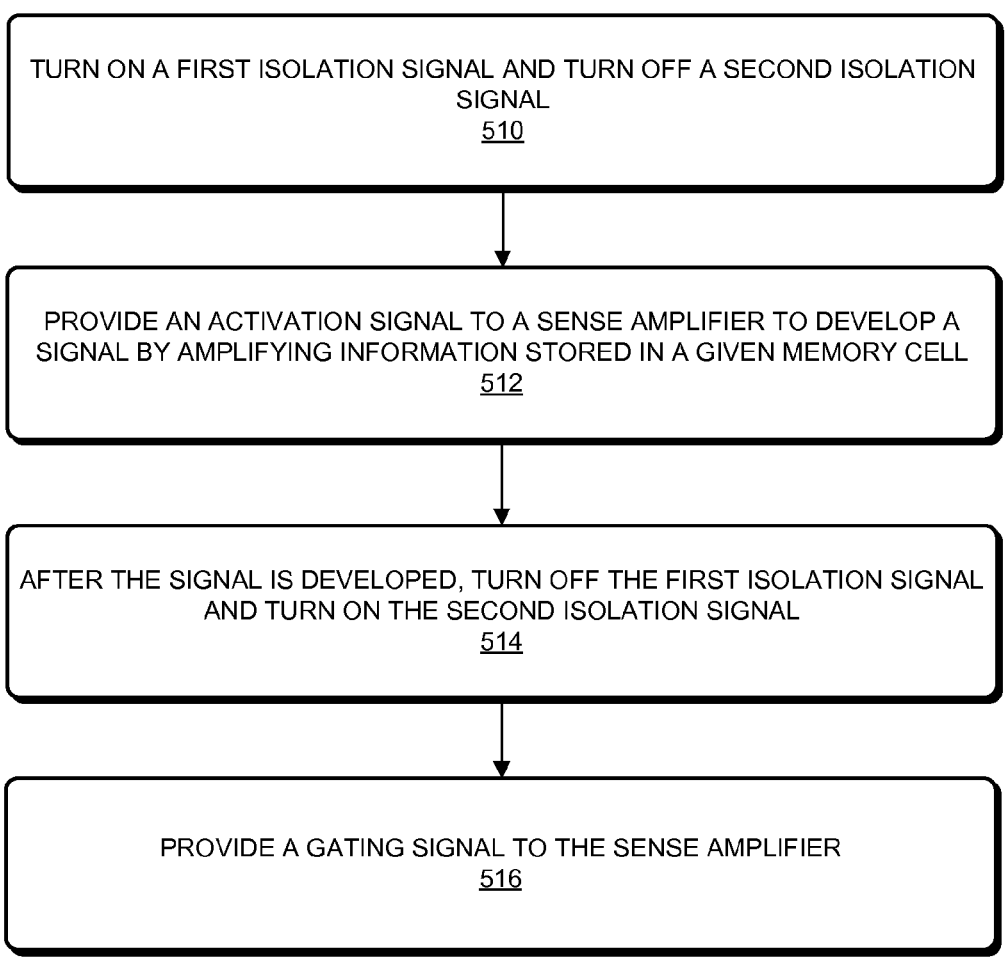
FIG. 5 is a flow chart illustrating a method for reading information from the memory device of FIG. 3A or 3B in response to the read command in accordance with an embodiment of the present disclosure.

We now describe embodiments of a method. FIG. 5 presents a flow chart illustrating a method 500 for reading information from a memory device, such as memory device 300 (FIG. 3A) or 350 (FIG. 3B). During this method, the memory device turns on a first isolation signal and turns off a second isolation signal (operation 510), thereby coupling the sense amplifier in the memory device to the given memory cell in an array of memory cells via a first bitline. Note that the given memory cell stores the information, and the memory cells in the array are coupled to the sense amplifier by the first bitline and a second bitline. Moreover, the memory device provides the activation signal to the sense amplifier to develop the signal by amplifying the information (operation 512). After the signal is developed, the memory device turns off the first isolation signal and turns on the second isolation signal (operation 514), thereby coupling the output of the sense amplifier to the unused I/O line of the memory device via the second bitline, as opposed to the I/O line of the memory device that is proximate to the sense amplifier. Furthermore, the memory device provides the gating signal to the sense amplifier, thereby outputting the signal on the unused I/O line (operation 516).

In some embodiments of method 500, there are additional or fewer operations. Moreover, the order of the operations may be changed, and/or two or more operations may be combined into a single operation.

Note that the technique for reading information may be applied to DRAM that uses a so-called 'open' DRAM architecture or a so-called 'folded' architecture in which multiple read (or write) commands are processed concurrently.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A memory device, comprising:
   an array of memory cells configured to store information;
   a first bitline coupled to the memory cells in the array and a second bitline coupled to the memory cells in the array; and
   a sense amplifier coupled to the first bitline and the second bitline, wherein the sense amplifier is configured: to receive the information stored in a given memory cell via one of the first bitline and the second bitline; in response to an activation signal, to develop a signal by amplifying the information; and, in response to a gating signal, output the signal;
   control logic which, in response to a read command, is configured to:
      turn on a first isolation signal and turn off a second isolation signal, thereby coupling the sense amplifier to the given memory cell via the first bitline;
      provide the activation signal to the sense amplifier to develop the signal;
      after the signal is developed, turn off the first isolation signal and turn on the second isolation signal, thereby coupling an output of the sense amplifier to an unused input/output (I/O) line of the memory device via the second bitline, as opposed to an I/O line of the memory device that is proximate to the sense amplifier; and
      provide the gating signal to the sense amplifier, thereby outputting the signal on the unused I/O line.

2. The memory device of claim 1, wherein the memory device further includes a word line coupled to the memory cells in the array;
   wherein the word line is configured to select the given memory cell; and
   wherein, in response to the read command, the control logic is configured to turn on the word line.

3. The memory device of claim 1, wherein the memory device further includes a transistor coupled to the second bitline and proximate to the unused I/O line;
   wherein the control logic is configured to provide another gating signal to the transistor; and
   wherein, in response to the other gating signal, the transistor is configured to drive the signal onto the unused I/O line.

4. The memory device of claim 1, wherein the memory device further includes another amplifier coupled to the second bitline and proximate to the unused I/O line;
   wherein the control logic is configured to provide another gating signal to the other amplifier; and
   wherein, in response to the other gating signal, the other amplifier is configured to amplify the signal received via the second bitline and to drive the signal onto the unused I/O line.

5. The memory device of claim 1, wherein the memory device includes dynamic random access memory (DRAM).

6. The memory device of claim 1, wherein the memory device includes NOR flash.

7. The memory device of claim 1, wherein, prior to providing the activation signal, the control logic is further configured to provide a pre-charge signal to the sense amplifier, thereby approximately zeroing the output of the sense amplifier.

8. The memory device of claim 7, wherein a propagation time to route the signal from the sense amplifier to the unused I/O line via the second bitline is less than a pre-charge time associated with the pre-charge signal.

9. The memory device of claim 1, wherein the first bitline and the second bitline each include a logically complementary pair of bitlines; and
   wherein the I/O line and the unused I/O line each include a pair of I/O lines.

10. A computer system, comprising a memory device, wherein the memory device includes:
    an array of memory cells configured to store information;
    a first bitline coupled to the memory cells in the array and a second bitline coupled to the memory cells in the array; and
    a sense amplifier coupled to the first bitline and the second bitline, wherein the sense amplifier is configured: to receive the information stored in a given memory cell via one of the first bitline and the second bitline; in response to an activation signal, to develop a signal by amplifying the information; and, in response to a gating signal, output the signal;
    control logic which, in response to a read command, is configured to:
       turn on a first isolation signal and turn off a second isolation signal, thereby coupling the sense amplifier to the given memory cell via the first bitline;
       provide the activation signal to the sense amplifier to develop the signal;
       after the signal is developed, turn off the first isolation signal and turn on the second isolation signal, thereby coupling an output of the sense amplifier to an unused I/O line of the memory device via the second bitline, as opposed to an I/O line of the memory device that is proximate to the sense amplifier; and
       provide the gating signal to the sense amplifier, thereby outputting the signal on the unused I/O line.

11. The computer system of claim 10, wherein the memory device further includes a word line coupled to the memory cells in the array;
    wherein the word line is configured to select the given memory cell; and
    wherein, in response to the read command, the control logic is configured to turn on the word line.

12. The computer system of claim 10, wherein the memory device further includes a transistor coupled to the second bitline and proximate to the unused I/O line;
    wherein the control logic is configured to provide another gating signal to the transistor; and
    wherein, in response to the other gating signal, the transistor is configured to drive the signal onto the unused I/O line.

13. The computer system of claim 10, wherein the memory device further includes another amplifier coupled to the second bitline and proximate to the unused I/O line;
    wherein the control logic is configured to provide another gating signal to the other amplifier; and
    wherein, in response to the other gating signal, the other amplifier is configured to amplify the signal received via the second bitline and to drive the signal onto the unused I/O line.

14. The computer system of claim 10, wherein the memory device includes dynamic random access memory (DRAM).

15. The computer system of claim 10, wherein the memory device includes NOR flash.

16. The computer system of claim 10, wherein, prior to providing the activation signal, the control logic is further configured to provide a pre-charge signal to the sense amplifier, thereby approximately zeroing the output of the sense amplifier.

17. The computer system of claim 16, wherein a propagation time to route the signal from the sense amplifier to the unused I/O line via the second bitline is less than a pre-charge time associated with the pre-charge signal.

18. The computer system of claim 10, wherein the first bitline and the second bitline each include a logically complementary pair of bitlines; and wherein the I/O line and the unused I/O line each include a pair of I/O lines.

19. A method for reading information from a memory device in response to a read command, the method comprising:

turning on a first isolation signal and turning off a second isolation signal, thereby coupling a sense amplifier in the memory device to a given memory cell in an array of memory cells via a first bitline, wherein the given memory cell stores the information, and wherein memory cells in the array are coupled to the sense amplifier by the first bitline and a second bitline;

providing an activation signal to the sense amplifier to develop a signal by amplifying the information;

after the signal is developed, turning off the first isolation signal and turning on the second isolation signal, thereby coupling an output of the sense amplifier to an unused I/O line of the memory device via the second bitline, as opposed to an I/O line of the memory device that is proximate to the sense amplifier; and providing a gating signal to the sense amplifier, thereby outputting the signal on the unused I/O line.

20. The method of claim 19, wherein the memory device includes a transistor coupled to the second bitline and proximate to the unused I/O line;

wherein, in response to the other gating signal, the method further includes providing another gating signal to the transistor, thereby driving the signal onto the unused I/O line.

* * * * *